(12) United States Patent
Kim et al.

(10) Patent No.: US 7,761,652 B2
(45) Date of Patent: Jul. 20, 2010

(54) MAPPING INFORMATION MANAGING APPARATUS AND METHOD FOR NON-VOLATILE MEMORY SUPPORTING DIFFERENT CELL TYPES

(75) Inventors: Jin-kyu Kim, Seoul (KR); Kyoung-il Bang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 585 days.

(21) Appl. No.: 11/738,232

(22) Filed: Apr. 20, 2007

(65) Prior Publication Data

US 2008/0077728 A1 Mar. 27, 2008

(30) Foreign Application Priority Data

Sep. 27, 2006 (KR) .................. 10-2006-0094298

(51) Int. Cl.
*G06F 12/00* (2006.01)
(52) U.S. Cl. .................. 711/103; 711/165; 711/170
(58) Field of Classification Search ............... None
See application file for complete search history.

(56) References Cited

U.S. PATENT DOCUMENTS

| 5,966,326 | A |  | 10/1999 | Park et al. |
| 6,067,248 | A | * | 5/2000 | Yoo .................. 365/185.03 |
| 6,522,586 | B2 |  | 2/2003 | Wong |
| 2004/0019761 | A1 |  | 1/2004 | Fukuzumi |
| 2004/0057316 | A1 |  | 3/2004 | Kozakai et al. |
| 2004/0186946 | A1 |  | 9/2004 | Lee |
| 2008/0256352 | A1 | * | 10/2008 | Chow et al. .................. 713/2 |
| 2008/0316819 | A1 | * | 12/2008 | Lee .................. 365/185.03 |
| 2009/0193184 | A1 | * | 7/2009 | Yu et al. .................. 711/103 |

FOREIGN PATENT DOCUMENTS

| JP | 9-293025 A | 11/1997 |
| KR | 1998-021156 A | 6/1998 |
| KR | 10-2004-0072875 A | 8/2008 |
| WO | 2005101211 A1 | 10/2005 |

* cited by examiner

*Primary Examiner*—Jack A Lane
(74) *Attorney, Agent, or Firm*—Sughrue Mion, PLLC

(57) ABSTRACT

The present invention relates to a mapping information managing apparatus and method for a non-volatile memory supporting different cell types, and more particularly, to a mapping information managing apparatus and method for a non-volatile memory supporting different cell types capable of managing mapping information considering physical characteristics of each cell type in the non-volatile memory supporting different cell types in which bits represented by one cell are different from each other. A mapping information managing apparatus for a non-volatile memory supporting different cell types includes: a user request unit used for a user to request a predetermined operation by using a logical address; a non-volatile memory comprising a plurality of memory areas having different cell types; and a mapping information managing unit storing mapping information on user data written to a second memory area of the plurality of memory areas in a first memory area.

13 Claims, 7 Drawing Sheets

SLC TYPE AREA

MLC TYPE AREA

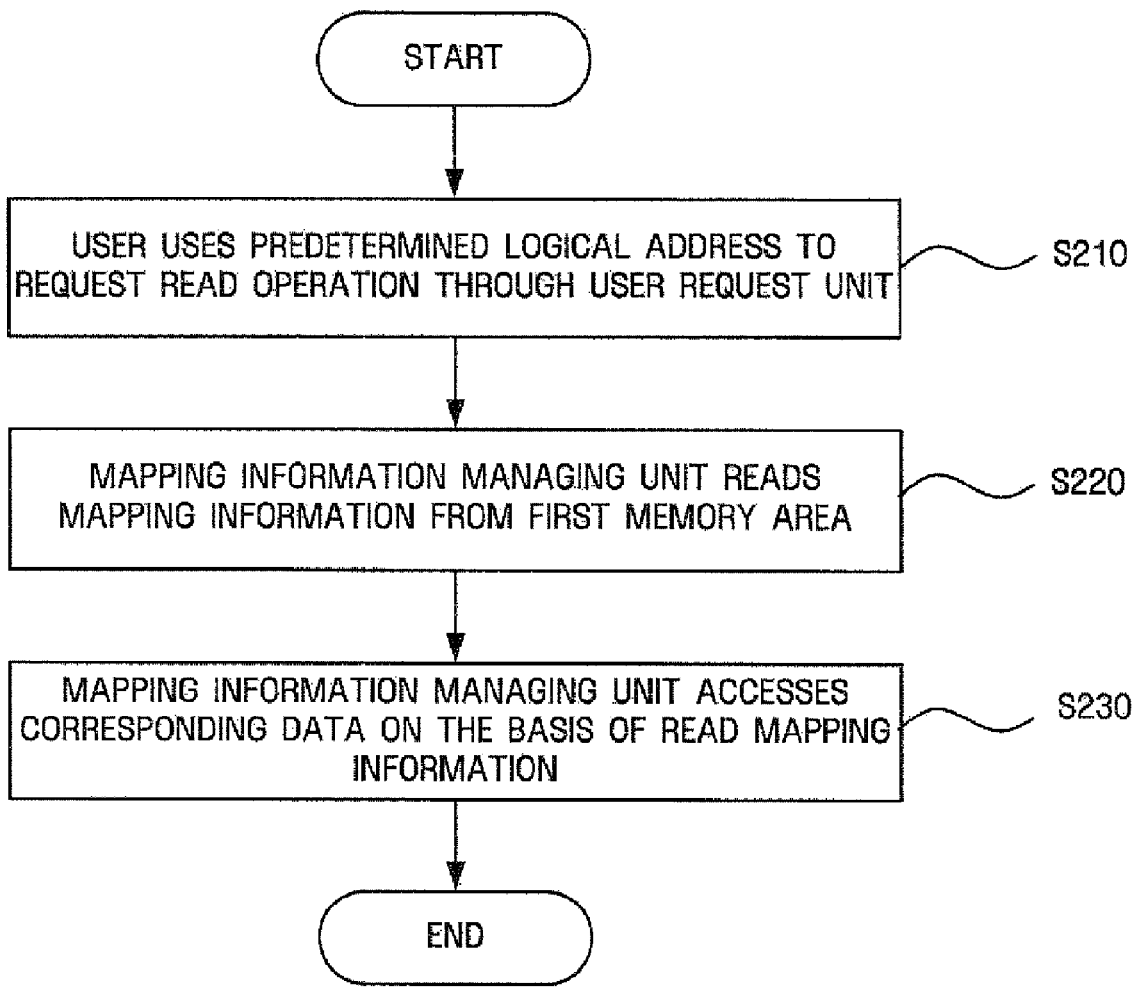

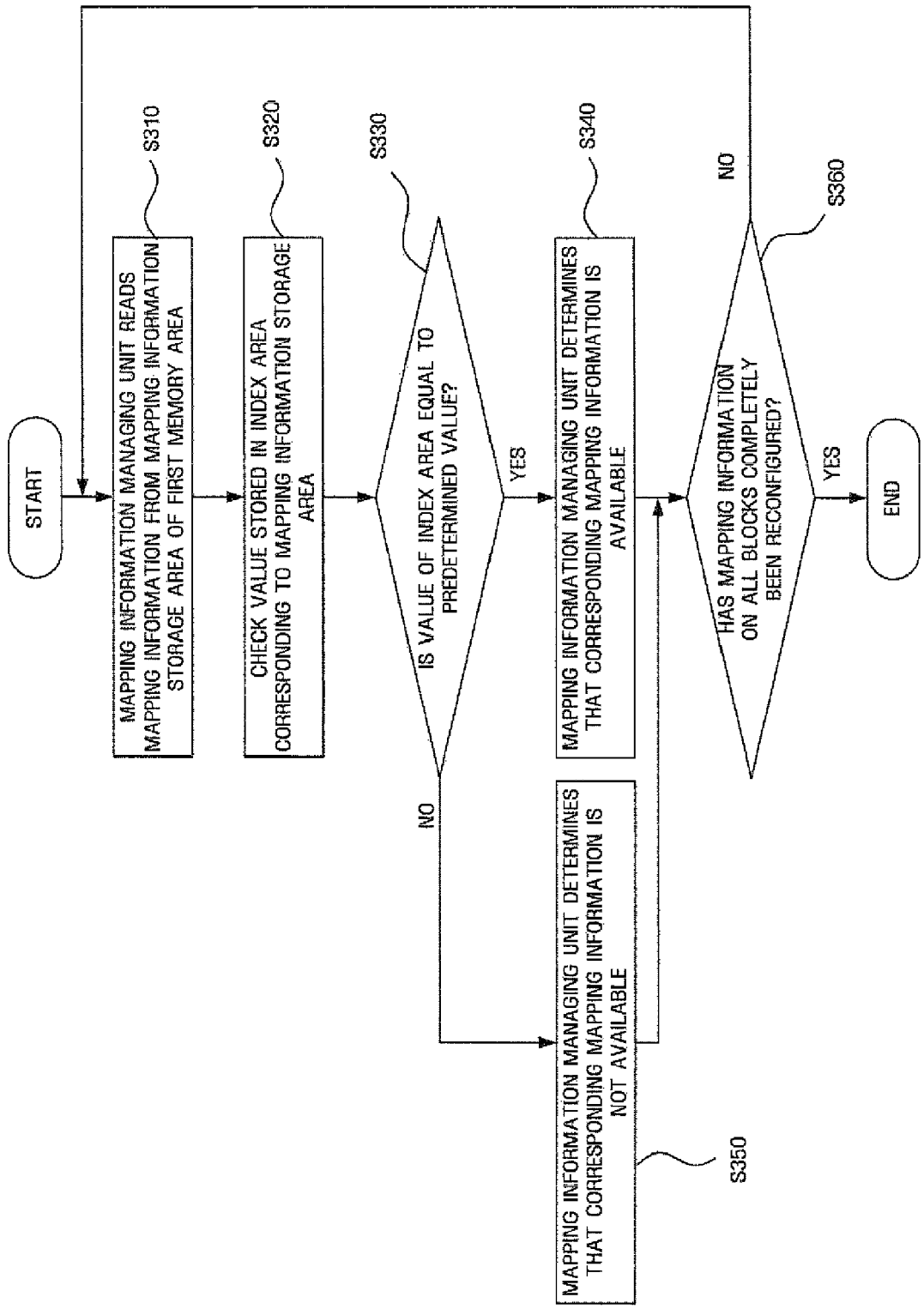

MAPPING INFORMATION MANAGING APPARATUS AND METHOD FOR NON-VOLATILE MEMORY SUPPORTING DIFFERENT CELL TYPES

CROSS REFERENCE TO RELATED APPLICATION

This application claims priority from Korean Patent Application No. 10-2006-0094298 filed on Sep. 27, 2006 in the Korean Intellectual Property Office, the disclosure of which is incorporated herein by reference in its entirety.

BACKGROUND OF THE INVENTION

1. Field of the Invention

Apparatuses and methods consistent with the present invention relate to managing mapping information for a non-volatile memory supporting different cell types, and more particularly, to a mapping information managing apparatus and method for a non-volatile memory supporting different cell types capable of managing mapping information considering physical characteristics of each cell type in the non-volatile memory supporting different cell types in which bits represented by one cell are different from each other.

2. Description of the Related Art

In general, non-volatile memories, serving as storage media for storing and processing data, have come into widespread use in embedded systems, such as electric home appliances, communication apparatuses, and set top boxes.

Flash memories mainly used as the non-volatile memories are non-volatile storage devices capable of electrically deleting data or restoring data, and are suitable for portable apparatuses having a small size since they have lower power consumption than storage media based on a magnetic disk memory and have a high access time like a hard disk.

In the flash memory, from the viewpoint of hardware characteristics, in order to perform a write operation on a memory sector having data written therein, an operation for deleting all blocks including the sector should be performed before the write operation. The erase-before-write operation causes the deterioration of the performance of the flash memory. In order to solve the problem, the concept of a logical address and a physical address has been introduced. That is, a read/write operation on the logical address is changed to a read/write operation on the physical address by various mapping algorithm, and then, the read/write operation is performed.

For example, when a user uses a predetermined logical address to request a write operation to a non-volatile memory, the write operation is performed on a physical address mapped to the logical address used in the non-volatile memory, and a read operation is performed in the same manner as the write operation. The mapping information on the logical address and the physical address is stored in a predetermined area of the non-volatile memory, and the mapping information is reconfigured when power is turned off and then turned on.

In this case, the physical address of the non-volatile memory is divided into an area for storing user data and an area for storing mapping information on the logical address and the physical address, but a cell type corresponding to the physical address is not considered. This is because apparatuses provided with the existing non-volatile memories are formed of the same cell type.

That is, the non-volatile memories are divided into several types according to the number of bits represented by one cell, from the viewpoint of hardware characteristics. For example, the flash memories are divided into two types, that is, a single level type (SLC) in which one bit is represented by one cell and a multi-level type (MLC) in which a plurality of bits are represented by one cell. The SLC type has a higher-speed read/write performance than the MLC type and also has a larger number of partial programming (NOP) than the MLC type. When the SLC type and the MLC type have the same physical size, the SLC type has a smaller storage capacity than the MLC type.

Since an apparatus having the non-volatile memory being currently produced is composed of only a single cell type, all physical addresses have the same performance and the same physical characteristic. Therefore, a method of effectively managing mapping information considering physical characteristics of memory areas of each cell type in a non-volatile memory supporting different cell types is needed.

Japanese Unexamined Patent Application Publication No. 2004-062328 discloses a method of changing a data flow according to the amount of data and the erased state of a physical block in a NAND flash memory having a user physical block and an erase physical block. However, a mapping method used for a non-volatile memory supporting different cell types has not been disclosed yet.

SUMMARY OF THE INVENTION

An aspect of the present invention is to provide a mapping information managing apparatus and method for a non-volatile memory supporting different cell types capable of determining a memory area for storing mapping information on a logical address and a physical address considering physical characteristics of memory areas of each cell type in the non-volatile memory to effectively manage the mapping information.

Aspects of the present invention are not limited to those mentioned above, and other aspects of the present invention will be apparently understood by those skilled in the art through the following description.

According to an aspect of the present invention, there is provided a mapping information managing apparatus for a non-volatile memory supporting different cell types, the apparatus including: a user request unit used for a user to request a predetermined operation by using a logical address; a non-volatile memory including a plurality of memory areas having different cell types; and a mapping information managing unit storing mapping information on user data written to a second memory area of the plurality of memory areas in a first memory area.

According to another aspect of the present invention, there is provided a mapping information managing method for a non-volatile memory supporting different cell types, the method including: when a user requests a predetermined operation by using a logical address, storing mapping information on user data written to a second memory area of a non-volatile memory including a plurality of memory areas having different cell types in a first memory area.

Details of other exemplary embodiments of the invention are included in the detailed description of the invention and the drawings.

BRIEF DESCRIPTION OF THE DRAWINGS

The above and other features and aspects of the present invention will become more apparent by describing in detail exemplary embodiments thereof with reference to the attached drawings in which:

FIG. 6 is a flow chart illustrating a read method in a non-volatile memory supporting different cell types according to an exemplary embodiment of the invention; and FIG. 7 is a flow chart illustrating a method of initializing mapping information according to an exemplary embodiment of the invention.

DESCRIPTION OF THE EXEMPLARY EMBODIMENTS

Figure 1:
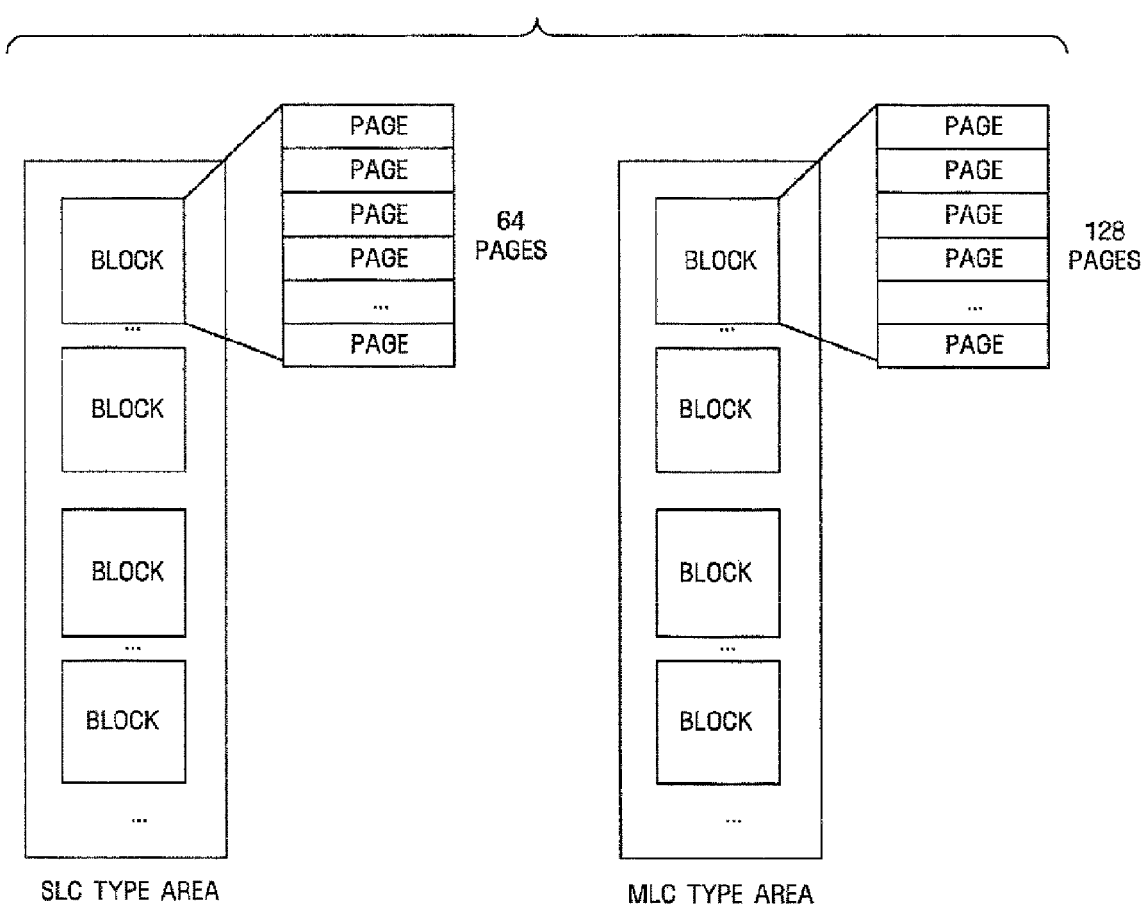
FIG. 1 is a diagram illustrating the structure of a non-volatile memory supporting different cell types according to an exemplary embodiment of the invention.

Aspects and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the present invention will only be defined by the appended claims. Like reference numerals refer to like elements throughout the specification.

The present invention will be described hereinafter with reference to block diagrams or flowchart illustrations of a mapping information managing apparatus and method for a non-volatile memory supporting different cell types according to exemplary embodiments thereof It will be understood that each block of the flowchart illustrations, and combinations of blocks in the flowchart illustrations can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions specified in the flowchart block or blocks. These computer program instructions may also be stored in a computer usable or computer-readable memory that can direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

And each block of the block diagrams may represent a module, segment, or portion of code, which comprises one or more executable instructions for implementing the specified logical function(s). It should also be noted that in some alternative implementations, the functions noted in the blocks may occur out of order. For example, two blocks shown in succession may in fact be executed substantially concurrently or the blocks may sometimes be executed in reverse order depending upon the functionality involved.

FIG. 1 is a diagram illustrating the structure of a general non-volatile memory.

As shown in FIG. 1, general non-volatile memories are divided into an SLC type and an MLC type according to the number of bits represented by one cell. The SLC type has a higher-speed read/write/erase performance and a larger NOP than the MLC type.

For example, when one bit is represented by one cell in the SLC type and two bits are represented by one cell in the MLC type, one block in a memory area of the SLC type is composed of 64 pages, and one block in a memory area of the MLC type is composed of 128 pages. When the size of the block is 128 KB in the SLC type, the size of the block is 256 KB in the MLC type. In this case, the size of the page may be 2112 bytes or 528 bytes. FIG. 1 shows one page having a size of 2112 bytes, but the size of the page is not limited to 2112 bytes or 528 bytes. For example, the size of the page may vary according to the usage environment of a non-volatile memory. In this case, when physical characteristics of the SLC type and the MLC type are not considered, user data and mapping information of a logical address mapped to a physical address to which the user data is written, are written to memory areas of each cell type.

The mapping information is more frequently updated than the user data. Since a high-speed read/write/erase performance is ensured in the memory area of the SLC type, a reduction in speed does not occur even when the mapping information is frequently updated. On the other hand, the memory area of the MLC type has a lower-speed read/write/erase performance than the memory area of the SLC type when the mapping information is frequently updated.

Figure 2:
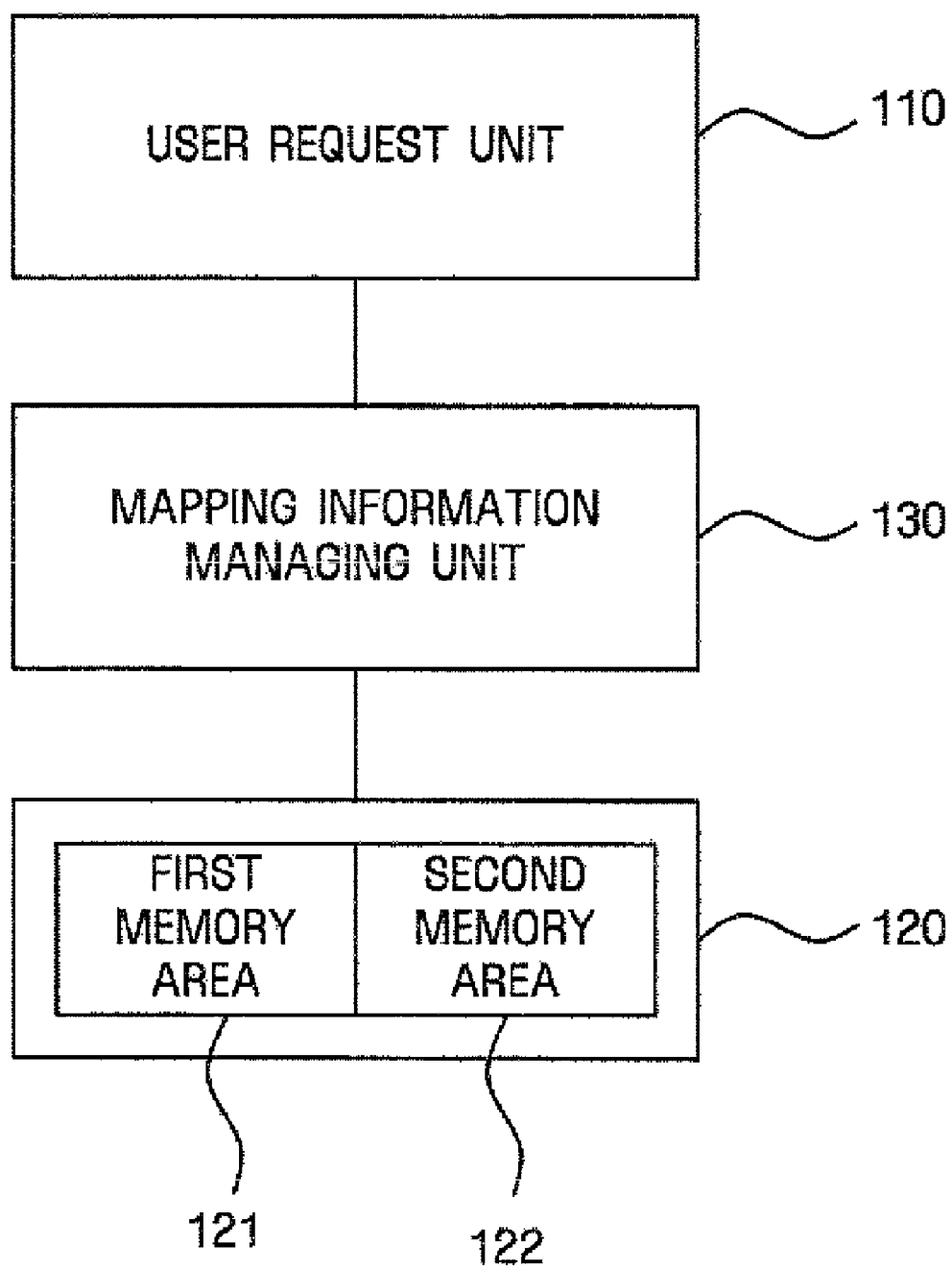
FIG. 2 is a diagram illustrating a mapping information managing apparatus for a non-volatile memory supporting different cell types according to an exemplary embodiment of the invention.

Therefore, a mapping apparatus and method for a non-volatile memory supporting different cell types according to exemplary embodiments of the invention considers physical characteristics of each cell type in the non-volatile memory supporting different cell types to improve the performance of the non-volatile memory. FIG. 2 is a diagram illustrating a mapping information managing apparatus for a non-volatile memory supporting different cell types according to an exemplary embodiment of the invention. In the following exemplary embodiments of the invention, the mapping information managing apparatus for a non-volatile memory supporting different cell types is simply referred to as a "mapping information managing apparatus".

As shown in FIG. 2, a mapping information managing apparatus 100 according to the exemplary embodiment of the invention includes a user request unit 110 that is used for a user to request a predetermined operation using a predetermined logical address, a non-volatile memory 120 having a first memory area 121 of a first cell type and a second memory area 122 of a second cell type, and a mapping information managing unit 130 that stores, i.e., manages the storing, in the second memory area 122, mapping information on the user data written to the first memory area 121 and the second memory area 122.

The user request unit 110 may be regarded as an application, such as a file system or a database management system (DMBS), that uses a storage device through a logical address. Therefore, the user can use a predetermined logical address to request a predetermined operation in the non-volatile memory 120 through the application.

The non-volatile memory 120 may include the first memory area 121 and the second memory area 122 of different cell types that have different read/write/erase performances and NOPs. In this exemplary embodiment of the invention, the first memory area 121 is an SLC type, and the second memory type 122 is an MLC type. However, the invention is not limited thereto. For example, the first memory area 121 and the second memory area 122 may have various cell types under the condition that the first memory area 121 and the second memory area 122 having different read/write/erase performances and NOPs. In addition, in this exemplary embodiment of the invention, since the first memory area 121 is the SLC type, the first memory area 121 has a higher-speed read/write/erase performance and a larger NOP than the second memory area 122 of the MLC type.

Figure 3:
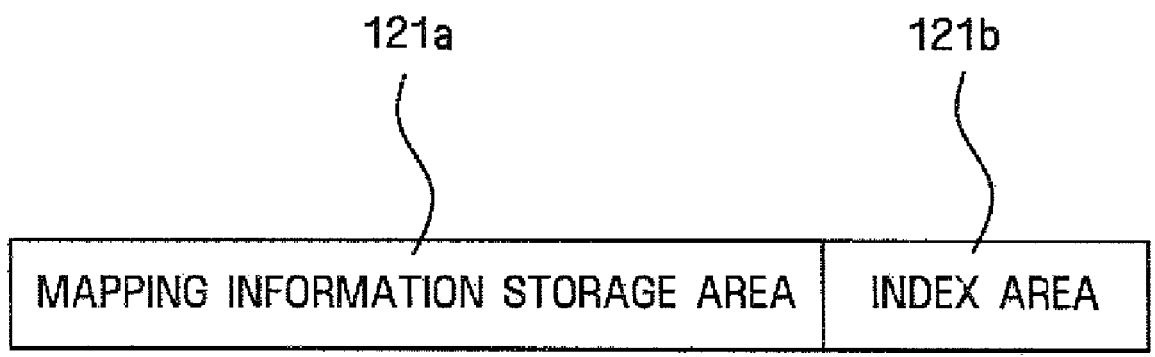
FIG. 3 is a diagram illustrating the structure of a first memory area according to an exemplary embodiment of the invention.

As shown in FIG. 3, the first memory area 121 may include a mapping information storage area 121a to which mapping information on the user data written to the second memory area 122 is written and an index area 121b that indicates whether the mapping information written to the mapping information storage area 121a is available. In this exemplary embodiment of the invention, the mapping information on the user data written to the second memory area 122 is written to the mapping information storage area 121a, but the invention is not limited thereto. For example, user data and mapping information corresponding to the first memory area 121 may be stored in the mapping information storage area 121a.

As described above, the mapping information on the user data written to the second memory area 122 is stored in the first memory area 121, and the mapping information has a smaller size than the user data and is more frequently updated than the user data. Therefore, the mapping information stored in the first memory area 121 having a higher read/write/erase performance than the second memory area 122 makes it possible to improve the performance of the non-volatile memory 120.

The mapping information managing unit 130 writes mapping information on logical and physical addresses of the user data written to the second memory area 122 to the mapping information storage area 121a of the first memory area 121 and also writes the user data to the second memory area 122. Then, the mapping information managing unit 130 writes a predetermined value to the index area 121b of the first memory area 121. That is, in this exemplary embodiment of the invention, before writing the user data to the second memory area 122, the mapping information managing unit 130 writes the mapping information and the user data to the mapping information storage area 121a of the first memory area 121 and the second memory area 122, respectively, and then writes a predetermined value to the index area 121b corresponding to the mapping information storage area 121a.

The reason is that, when the supply of power to the non-volatile memory 120 is suddenly cut off and thus the mapping information needs to be reconfigured, the mapping information managing unit 130 can determine the availability of the user data corresponding to the mapping information storage area 121a on the basis of the value written to the index area 121b. For example, the mapping information managing unit 130 may write a value "FF" to the index area 121b before the user data is completely written to the second memory area 122 and write a value "00" to the index area 121b after the user data is completely written to the second memory area 122. Therefore, in a case in which power is supplied after the power supply is suddenly cut off and thus the mapping information needs to be reconfigured, when the value "FF" is written to the index area 121b, the mapping information managing unit 130 determines that the user data is not available, and when the value "00" is written to the index area 121b, the mapping information managing unit 130 determines that the user data is available.

The mapping information managing unit 130 may store, i.e., manage the storing of, mapping information on at least one block included in the second memory area 122, in the mapping information storage area 121a of the first memory area 121.

When the user request unit 110 requests the mapping information managing unit 130 to read the user data from the second memory area 122, the mapping information managing unit 130 may access to the requested user data in the second memory area 122 on the basis of the mapping information stored in the mapping information storage area 121a of the first memory area 121.

Figure 4:
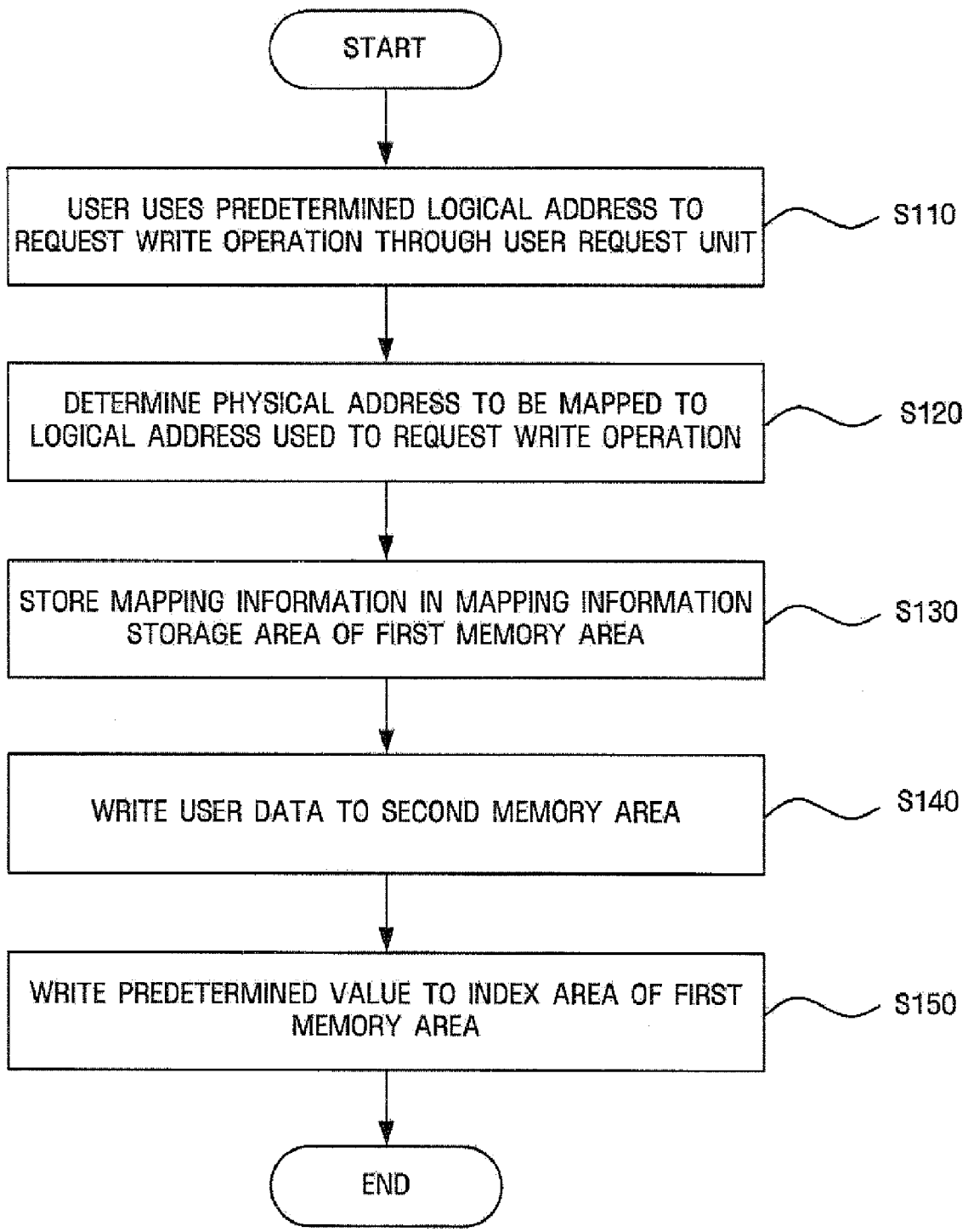
FIG. 4 is a flow chart illustrating a write method in a non-volatile memory supporting different cell types according to an exemplary embodiment of the invention.

FIG. 4 is a flow chart illustrating a write method for a non-volatile memory supporting different cell types. The write method shown in FIG. 4 is an example of a method of writing user data to the second memory area 122.

As shown in FIG. 4, in the write method for a non-volatile memory supporting different cell types according to an exemplary embodiment of the invention, first, the user uses a predetermined logical address to request a user data write operation through the user request unit 110 (S110).

Then, the mapping information managing unit 130 determines a physical address to be mapped to a logical address used to request the write operation (S120), and stores mapping information on the logical address and the physical address in the mapping information storage area 121a of the first memory area 121 (S130).

In this exemplary embodiment of the invention, the mapping information managing unit 130 stores, i.e., manages the storing, in the first memory area 121, the mapping information when the physical address of the second memory area 122 is mapped. In this case, since the first memory area 121 has a higher-speed read/write/erase performance than the second memory area 122, mapping information on the physical address included in the first memory area 121 is stored in the first memory area 121, and mapping information on the physical address included in the second memory area 122 is stored in the first memory area 121, which prevents the processing speed of the entire system from being lowered due to the mapping information that is frequently updated in the first memory area 121.

When the user data is completely written to the second memory area 122 by the write operation (S140), the mapping information managing unit 130 writes a predetermined value to the index area 121b corresponding to the mapping information storage area 121a having the mapping information stored therein (S150).

Figure 5:
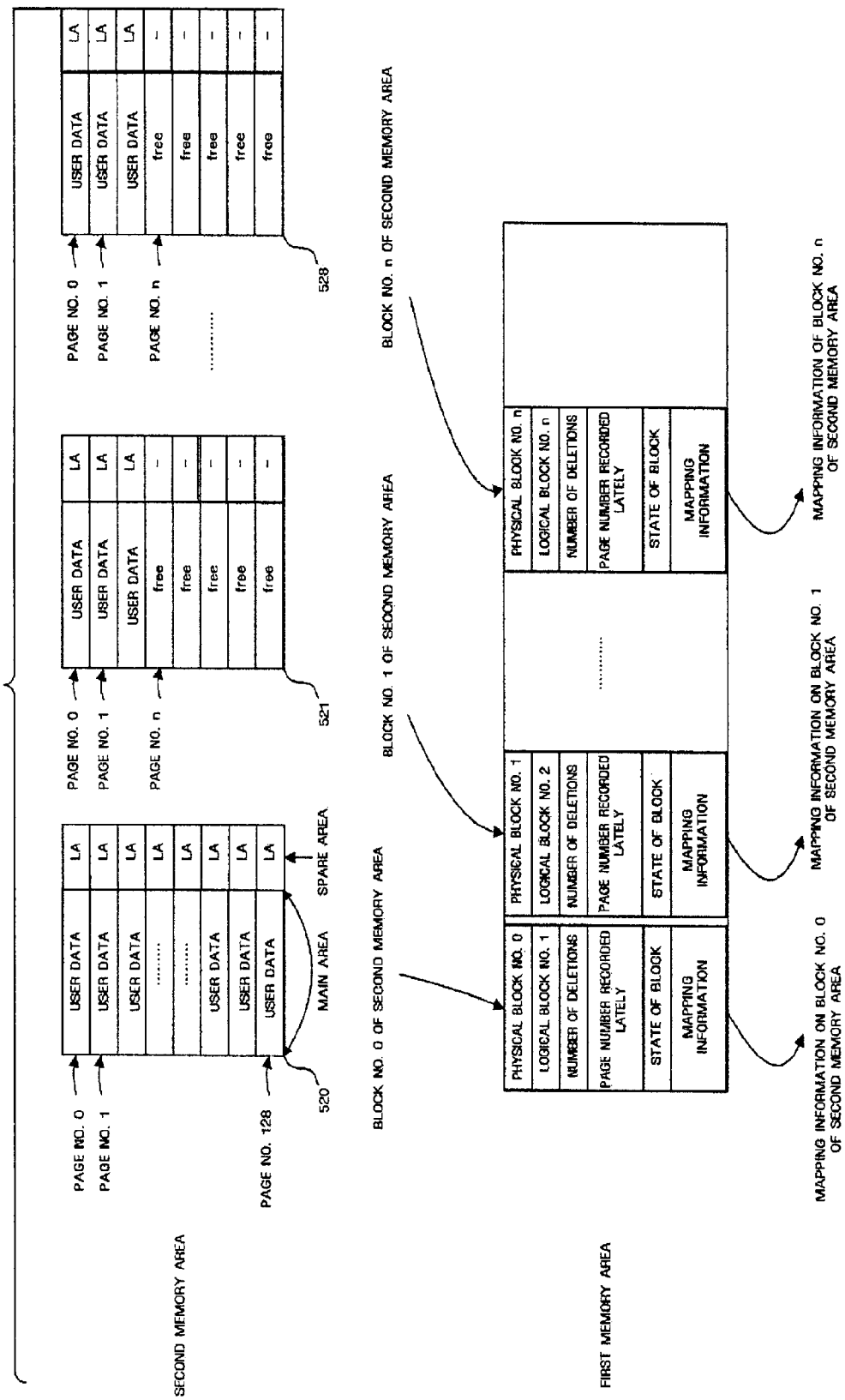
FIG. 5 is a diagram illustrating first and second memory areas according to an exemplary embodiment of the invention.

FIG. 5 is a diagram illustrating the mapping information stored in the first memory area and the user data stored in the second memory area according to an exemplary embodiment of the invention.

As shown in FIG. 5, when user data is written to each block (block number 0 520, block number 1 521, ..., block number n 528) of the second memory area 122, mapping information including a physical block number, a logical block number, the number of deleting operations, the state of blocks, and mapping information may be written to the first memory area 121 by the method shown in FIG. 4.

FIG. 6 is a flow chart illustrating a read method for a non-volatile memory supporting different cell types according to an exemplary embodiment of the invention. The read method shown in FIG. 6 is an example of a user's request to read user data stored in the second memory area 122.

As show in FIG. 6, in the read method for a non-volatile memory supporting different cell types according to the exemplary embodiment of the invention, first, the user uses a predetermined logical address to request a user data read operation through the user request unit 110 (S210).

Then, the mapping information managing unit 130 reads out mapping information on the requested read data from the first memory area 121 (S220).

Subsequently, the mapping information managing unit 130 extracts the user data requested to read out on the basis of the read mapping information and transmits the extracted user data to the user request unit 110 (S230).

In the write method and the read method for the non-volatile memory supporting different cell types according to the exemplary embodiment of the invention shown in FIGS. 4 and 6, the mapping information on the user data written to the second memory area 122 is stored in the mapping information storage area 121a of the first memory area 121, and the stored mapping information is used to access the user data written to the second memory area 122. Therefore, the mapping information that is frequently updated is stored in the first memory area 121 and the user data that is a larger size than the mapping information and is less frequently updated than the mapping information is stored in the second memory area 122 in consideration of the physical characteristics of the first memory area 121 and the second memory area 122, which makes it possible to improve the performance of an apparatus using the non-volatile memory 120.

Meanwhile, in this exemplary embodiment of the invention, when the supply of power to the non-volatile memory is cut off due to an unexpected power failure and then power is supplied again, the mapping information managing unit 130 may perform an initializing operation of reconfiguring mapping information on the basis of the mapping information stored in the first memory area 121.

FIG. 7 is a flow chart illustrating a method of initializing mapping information according to an exemplary embodiment of the invention.

As shown in FIG. 7, in the method of initializing mapping information according to the exemplary embodiment of the invention, the mapping information managing unit 130 reads out the mapping information stored in the first memory area 121 (S310). In this case, the mapping information managing unit 130 may read out the mapping information storage area 121a, such as a page or sector having the mapping information stored therein. In this exemplary embodiment, it is considered that the mapping information managing unit 130 reads out a page.

The mapping information managing unit 130 checks the value written to the index area 121b corresponding to the mapping information storage area 121a (S320). When it is checked that the read value is a predetermined value (S330), the mapping information managing unit 130 determines that the mapping information managing unit is available (S340). On the other hand, when it is checked that the read value is not the predetermined value, the mapping information managing unit 130 determines that the mapping information managing unit is not available (S350).

Then, steps S310 to S340 are repeated until there is no block requiring the reconfiguration of the mapping information in the second memory area 122, that is, until the reconfiguration of the mapping information is completed (S360).

The terms "unit" or "module" as used herein, refers to, but is not limited to, a software or hardware component, such as a field programmable gate array (FPGA) or an application specific integrated circuit (ASIC), which performs certain tasks. A module or unit may advantageously be configured to reside on the addressable storage medium and may be configured to execute on one or more processors. Thus, a module or unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules or units may be combined into fewer components and modules or units or further separated into additional components and modules or units.

Although the mapping apparatus and method for a non-volatile memory supporting different cell types according to the exemplary embodiments of the present invention have been described with reference to the accompanying drawings, it will be apparent to those skilled in the art that various modifications and changes may be made thereto without departing from the scope and spirit of the invention. Therefore, it should be understood that the above exemplary embodiments are not limitative, but illustrative in all aspects.

As described above, according to the mapping apparatus and method for a non-volatile memory supporting different cell types of the exemplary embodiments of the invention, data to be stored is divided into mapping data and user data considering characteristics of physical addresses included in memory areas of each cell type in a non-volatile memory supporting different cell types, which makes it possible to improve the operational performance of the non-volatile memory.

What is claimed is:

1. A mapping information managing apparatus for a non-volatile memory supporting different cell types, comprising:
   a user request unit which requests a predetermined operation by using a logical address;
   a non-volatile memory comprising a plurality of memory areas comprising different cell types; and
   a mapping information managing unit which manages a storing of mapping information on user data written to a second memory area of a second cell type of the plurality of memory areas, in a first memory area of a first cell type.

2. The mapping information managing apparatus of claim 1, wherein:
   the first memory area is a single level cell (SLC) type, and the second memory area is a multi-level cell (MLC) type.

3. The mapping information managing apparatus of claim 1, wherein:
   the first memory area comprises:
      a mapping information storage area which stores the mapping information on the user data written to the second memory area; and
      an index area which indicates whether the mapping information stored in the mapping information storage area is available.

4. The mapping information managing apparatus of claim 3, wherein:
   the mapping information managing unit stores the mapping information in the mapping information storage area before the user data is completely written to the second memory area, and if the writing of the user data is completed, the mapping information managing unit writes a predetermined value to the index area.

5. The mapping information managing apparatus of claim 4, wherein:
the mapping information managing unit determines whether the mapping information stored in the mapping information storage area is available based on a value written to the index area, and
the mapping information managing unit reconfigures the mapping information if it is determined that the mapping information is available.

6. The mapping information managing apparatus of claim 1, wherein data stored in the first memory area is more frequently updated than data stored in the second memory area.

7. A mapping information managing method for a non-volatile memory supporting different cell types, the method comprising:
requesting, by a user, a predetermined operation by using a logical address; and
managing a storing of mapping information on user data written to a second memory area of a second cell type of a non-volatile memory, in a first memory area of a first cell type, wherein the non-volatile memory comprises a plurality of memory areas having different cell types.

8. The mapping information managing method of claim 7, wherein the first memory area is a single level cell (SLC) type, and the second memory area is a multi-level cell (MLC) type.

9. The mapping method of claim 7, wherein the first memory area includes a mapping information storage area which stores the mapping information on the user data written to the second memory area and an index area which indicates whether the mapping information stored in the mapping information storage area is available.

10. The mapping information managing method of claim 9, wherein:
the storing of the mapping information comprises:
storing the mapping information in the mapping information storage area before the user data is completely written to the second memory area; and
if the writing of the user data is completed, writing a predetermined value to the index area.

11. The mapping information managing method of claim 10, further comprising:
determining whether the mapping information stored in the mapping information storage area is available based on a value written to the index area; and
reconfiguring the mapping information if it is determined that the mapping information is available.

12. The mapping information managing method of claim 7, wherein data stored in the first memory area is more frequently updated than data stored in the second memory area.

13. A computer readable memory storing instructions to perform the steps of:
requesting a predetermined operation by using a logical address; and
managing a storing of mapping information on user data written to a second memory area of a second cell type of a non-volatile memory, in a first memory area of a first cell type, wherein the non-volatile memory comprises a plurality of memory areas having different cell types.

* * * * *